US005627534A

United States Patent [19]
Craft

[11] Patent Number: 5,627,534
[45] Date of Patent: May 6, 1997

[54] DUAL STAGE COMPRESSION OF BIT MAPPED IMAGE DATA USING REFINED RUN LENGTH AND LZ COMPRESSION

[75] Inventor: David J. Craft, Austin, Tex.

[73] Assignee: International Business Machines Corporation, Armonk, N.Y.

[21] Appl. No.: 409,766

[22] Filed: Mar. 23, 1995

[51] Int. Cl.$^6$ .................................................. H03M 7/42
[52] U.S. Cl. ............................. 341/87; 341/62; 341/107
[58] Field of Search .................................. 341/51, 55, 63, 341/67, 82, 87, 107

[56] References Cited

U.S. PATENT DOCUMENTS

| | | | |
|---|---|---|---|
| 4,316,222 | 2/1982 | Subramaniam | 358/261 |
| 4,626,829 | 12/1986 | Hauck | 340/347 |
| 4,647,923 | 3/1987 | Carleton, Jr. | 340/723 |
| 4,971,407 | 11/1990 | Hoffman | 341/87 |
| 4,988,998 | 1/1991 | O'Brien | 314/55 |
| 5,003,307 | 3/1991 | Whiting et al. | 341/51 |
| 5,109,433 | 4/1992 | Notenboom | 382/40 |
| 5,146,221 | 9/1992 | Whiting et al. | 341/67 |
| 5,155,484 | 10/1992 | Chambers, IV | 341/55 |
| 5,247,638 | 9/1993 | O'Brien et al. | 395/425 |
| 5,298,895 | 3/1994 | Van Maren | 341/51 |
| 5,339,076 | 8/1994 | Jiang | 341/51 |
| 5,341,440 | 8/1994 | Earl et al. | 382/56 |
| 5,369,605 | 11/1994 | Parks | 364/715.09 |
| 5,379,036 | 1/1995 | Storer | 341/51 |
| 5,389,922 | 2/1995 | Seroussi et al. | 341/51 |
| 5,412,429 | 5/1995 | Glover | 348/398 |
| 5,479,587 | 12/1995 | Campbell et al. | 395/116 |
| 5,483,622 | 1/1996 | Zimmerman et al. | 395/114 |
| 5,488,364 | 1/1996 | Cole | 341/50 |

FOREIGN PATENT DOCUMENTS

| | | |
|---|---|---|
| 494038A2 | 7/1992 | European Pat. Off. . |
| 546863A2 | 6/1993 | European Pat. Off. . |

OTHER PUBLICATIONS

*Journal of the Association for Computing Machinery*, "Data Compression via Textual Substitution", Storer et al, pp. 928–951 Oct. 1982.

*The Australian Computer Journal*, vol. 19, No. 2, May 1987, "A Linear Algorithm for Data", pp. 64–68.

*IEEE Transactions on Communications*, vol. Com-34, No. 12, Dec. 1986, "Better OPM/L Text Compression", pp. 1176–1182.

*IEEE Transactions on Information Theory*, vol. IT-23, No. 3, May 1977, "A Universal Algorithm for Sequential Data Compression", pp. 337–343.

IBM TDB, "Optimal Compression and Routing in Networks", vo. 34, No. 3, Aug. 1991, pp. 19–21.

*Efficient Storage, Computation, and Exposure of Computer–Generated Holograms by Electron–Beam Lithography*, Applied Optics, May 1993, No. 14, New York, Newman et al, pp. 2555–2565.

*Data Compression Techniques for Maps*, 1989 Southeastcon, Apr., 1989, IEEE Proceedings, Lohrenz et al, pp. 878–883.

*Primary Examiner*—Jeffrey A. Gaffin
*Assistant Examiner*—Jason H. Vick
*Attorney, Agent, or Firm*—Casimer K. Salys

[57] ABSTRACT

A dual stage data lossless compressor for optimally compressing bit mapped imaged data. The first stage run length compresses data bits representing pixel positions along a scan line of a video image to data units of fixed length. The units alternate to represent runs of alternate video image data values. The run length compressed data units are subject to second stage compression using a sliding window Lempel-Ziv compressor. The output from the Lempel-Ziv compressor includes raw tokens of fixed length and compressed tokens of varying lengths. The combination of a run length precompressor and a sliding window Lempel-Ziv post compressor, in which the run length compressor output is a succession of data units of fixed length, provides an optimum match between the capabilities and idiosyncracies of the two compressors, and related decompressors, when processing business form data images. Furthermore, the asymmetric simplicity of Lempel-Ziv sliding window decompression and run length decompression simplicity leads to a decompression speed compatible with contemporary applications.

24 Claims, 7 Drawing Sheets

FIG. 3

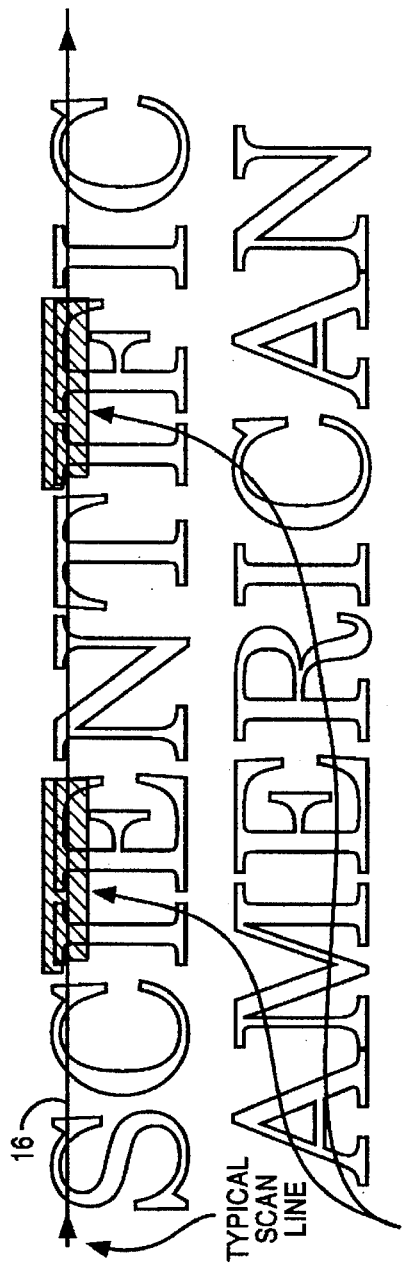

TYPICAL SCAN LINE — 16

* The two shaded areas above will yield identical bit pattern sequences for each scan line that passes thru them. One sample scan line is shown.

* The above is a 2x enlargement of the original, and at 1200 dpi the scan line shown would have a bit pattern like:

17 → ... 111 (155 'ones') 111 000 (225 'zeros') 000 111 (155 'ones') 111 000 (187 'zeros') 000 111 (94 'ones') 111 ...

| Body of 'I' | Space to next char | Body of 'E' or 'F' | Space | Upper serif of 'E' or 'F' |

* The run length compressor will produce 5 bytes for each of the two shaded areas with a combined bit count of 1632 bits per scan line:

'IE'
| '1' | '0' | '1' | '1' | ... | '1' |
| 155 | 225 | 155 | 187 | | 94 |

'IF'
| '1' | '0' | '1' | '1' | '0' | '1' |
| 155 | 225 | 155 | 187 | 0 | 94 |

80 BITS

* The LZ_1 compressor will further reduce these 10 bytes, assuming no previous matches:

19 → ... 0 | 155 CODE | 0 | 225 CODE | 0 | 155 CODE | 0 | 187 CODE | 0 | 94 CODE | 1 | CT=5 | DISP
        1    8          1    8          1    8          1    8          1    8        1    4     9

59 BITS

DUAL STAGE COMPRESSION OF BIT MAPPED IMAGE DATA USING REFINED RUN LENGTH AND LZ COMPRESSION

The invention in the present application is related to the subject matter in U.S. patent application Ser. No. 08/537,569, which is a continuation of U.S. patent application Ser. No. 08/290,451, filed Aug. 15, 1994 (now abandoned), which is a continuation of U.S. patent application Ser. No. 07/807,007, filed Dec. 13, 1991 (now abandoned); U.S. patent application Ser. No. 08/173,738, filed Dec. 23, 1993 (allowed and issue fee paid); and U.S. patent application Ser. No. 08/355,865, filed Dec. 14, 1994.

FIELD OF THE INVENTION

The present invention relates generally to systems and methods for compressing data. More particularly, the invention is directed to systems and methods for optimally combining run length compression concepts with sliding window type Lempel-Ziv data compression to accentuate the lossless compression of digital bit mapped image data of the type routinely created, transmitted, stored and printed using data processing systems.

BACKGROUND OF THE INVENTION

Digital data compression is a technology experiencing accentuated interest in recent years. In part, this is a consequence of the growing use of personal computers and workstations with high resolution graphic display systems. The volume of digital data used to represent the video information, as well as the speed with which that data must be compressed and decompressed, in the course of storage, transmission or physical rendering has motivated significant investigation in the technologies relating to data compression. In the data storage applications, the use of data compression increases the effective storage capacity of hard disks and CD drive systems, and is particularly important for compact non-volatile solid state storage devices such as PCMCIA cards. In the area of networks and communications, the transmission of data in compressed form increases the effective bandwidth of the media. In the field of physical rendering, hardware constraints often require that images be stored for access as complete units. Laser printers are an example of where data compression allows the use of smaller buffer memories to store full images.

A variety of lossless data compression methods and systems exist. The selection of a preferred approach is not always clear, in that one must consider the data compression ratio, the robustness of the method across different data types, the complexity of the effective algorithm, whether the technique is amenable to hardware or software implementation, and the effective speeds of encoding and decoding when compared to the needs of the application. Symmetry or asymmetry in the compression and decompression of the method chosen is particularly important, in that it should match the operational capabilities of the system. For example, if the compression is being accomplished in the context of a hard disk drive, and the read operation from the hard disk drive is performed at four times the rate of the write operation, then the decompression associated with the selected compression technique should ideally be correspondingly faster.

A data compression algorithm which has proven to be quite popular was first described in an article entitled "A Universal Algorithm for Sequential Data Compression" by authors Lempel and Ziv, as appeared in the IEEE Transactions on Information Theory, Volume IT-23, No. 3, pp. 337–343, 1977, generally referred to as the LZ-1 data compression algorithm. The LZ-1 algorithm has been refined in various respects by subsequent investigators, examples being the variances described in U.S. Pat. Nos. 5,003,307 and 5,146,221, the subject matter of which is incorporated by reference herein.

The fundamental concepts which characterize these and other versions of the basic LZ-1 algorithm involve the use of a buffer to store received data and to identify matches between newly received strings of data and previously received and processed strings of data. Thereby, new strings of data, typically sequences of bytes representing alpha numeric characters which match preceeding strings can be encoded simply by reference to these prior strings, using just location and length data incorporated into what are commonly known as tokens. The LZ-1 algorithm is dynamic in that new data is entered into the buffer which stores the earlier data after the comparison and encoding of the new data is completed. The size of the buffer is analogous to a sliding window over a data stream in which the new data characters are always compared to previously received characters within the length of the window. The encoded output is either a raw/literal token, indicating no compression, or a compressed/string token, the latter providing a length and an offset identifying the previously existing matching character string within the window. In many cases, the algorithm is increasingly effective as the size of the window increases and the repetition rate of the patterns in the data characters within the window increases.

More recent refinements directed toward increasing the speed of compression of the LZ-1 algorithm are described in the aforementioned patent applications. For example, U.S. patent application Ser. No. 08/290,451, the subject matter of which is incorporated by reference herein, relates to a use of a content addressable memory (CAM) to accelerate the comparison of new data with previously received strings of data.

Another technique, using a character history bit pattern memory to accelerate the compression operation, is described in U.S. patent application Ser. No. 08/173,738, the subject matter of which is incorporated by reference herein. The character history bit pattern memory implementation utilizes marker bits within the memory to identify matches between new data and previously received data. The speed of data compression is further accelerated through the use of the apparatus described in U.S. patent application Ser. No. 08/355,865, the subject matter of which is incorporated herein by reference, where the shifting operations accomplished with reference to the character history bit pattern buffer are rearranged for faster software implemented shifting. The focus of all these refinements to the compression side of the LZ-1 technique are attributable to the fact that the LZ-1 technique is highly asymmetric, in that decompression is very easy and fast, in software or hardware, as compared to compression. Thus, when the speed and efficiency of compression is improved the LZ-1 technique provides tremendous potential in the overall compression and decompression operation. The LZ-1 method is already highly desirable in that the asymmetry matches the operational characteristics of hard disk drives and CD drives.

Though the present invention has broad applicability, an area of particular and motivating concern is in small laser printers. Printer manufacturers constantly strive to differentiate their products from the competition in three main areas, these being price, resolution end printing speed. A funda-

3 mental attribute of all laser printers is the xerographic process, an image formation process which is best not interrupted. The data for the complete image to be physically rendered by the printer must be available during the brief discharge interval of each page printing cycle. Therefore, such printers require that the bit map for the full page be resident in memory for uninterrupted flow to the discharge photoconductor. Uncompressed, each pixel position of the image requires a single bit of memory. For contemporary 600 dot per inch (dpi) printers this means a memory of approximately 34M bits for each uncompressed page stored. With a trend toward 1200 dpi printer resolutions, that memory requirement increases by a factor of 4.

Given the tremendous price competition in this industry, and the trend to higher resolutions and printing speed, as reflected in the number of pages that must be stored, there has evolved a specific need for apparatus and methods which efficiently and quickly compress and decompress bit mapped images of the type used with printers. With the trend toward color rendering, the data volume per pixel position will obviously increase in proportion to the color resolution.

Though the asymmetry of the LZ-1 technique makes it particularly desirable from a decompression speed standpoint, investigation has shown that it does not efficiently compress binary bit mapped data characterizing images of the types conventionally printed in commercial applications. Therefore, what is needed, are systems and methods which exhibit the high compression efficiency and decompression simplicity of the LZ-1 algorithm implemented so as to efficiently compress bit mapped type image data.

SUMMARY OF THE INVENTION

The present invention provides the desired efficient and timely compression and decompression of bit mapped image data through a digital data lossless compression apparatus, which acts upon a source of binary format serial input data using a first compression means for receiving the serial input data and run length compressing the binary format serial input data into first data units of fixed size and sequentially defined binary value, a second compression means for receiving the first data units of fixed size and Lempel-Ziv sliding window compressing the first data units of fixed size into tokens of both fixed size types and variable size types, and means for transmitting the tokens. The invention also relates to methods for accomplishing the corresponding features of this apparatus.

In one form the invention relates to multiple stage compression and decompression, where the binary bit mapped image as input data is first subject to run length compression to form a succession of fixed size units containing binary value information about the image pixels. The run length compressed units of fixed size serve as the input to the LZ-1 compressor. The tokens from the LZ-1 compressor are transmitted to a storage medium or over a communication medium. Compression efficiency is accentuated in two respects. First, an efficient run length compression technique conveys the full binary value information while using data units of fixed byte size. Second, the application of LZ-1 further compresses such data units. The fundamental match between the LZ-1 compressor input and the embodying run length compression output provides exceptional compression ratios for binary bit mapped format image data, which compression ratios increase as the resolution of the image data increases.

These and other features of the invention will be more clearly understood and appreciated upon considering the detailed description of a preferred embodiment as follows.

BRIEF DESCRIPTION OF THE DRAWINGS

FIG. 3 is a schematic illustrating by example the activities associated with compressing a bit mapped image according to the invention.

DESCRIPTION OF THE PREFERRED EMBODIMENT

Figure 1:
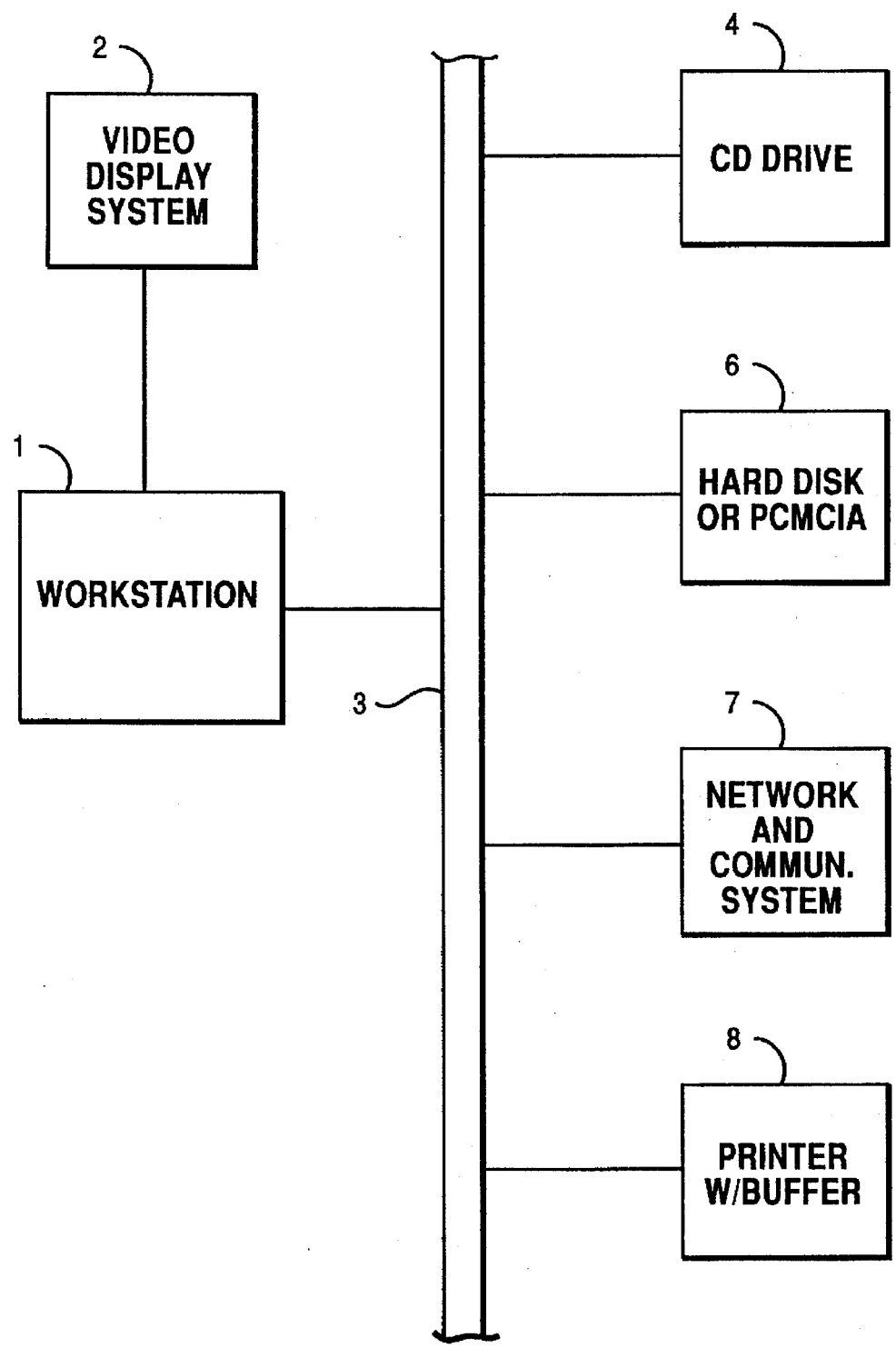
FIG. 1 is a schematic block diagram of a system using compression apparatus and methods.

FIG. 1 schematically depicts by functional block diagram the broad context within which the invention can be practiced. However, it is not intended to be all encompassing given the applicability of lossless digital data compression. Furthermore, the compression and decompression described with reference to the present invention is not limited to being implemented within the workstation, whether that be by hardware or software, but may be resident in the individual functional subsections either as a whole, including both compression and decompression functions, or only in part.

FIG. 1 shows that workstation 1 is connected to a video display system 2 and is communicatively coupled to a bus 3 so as to provide bi-directional digital data transmission capabilities to and from CD drive 4, hard disk or PCMCIA card nonvolatile memory 6, network and communication system 7, and printer 8. The preferred embodiment set forth hereinafter is described with reference to the efficient manipulation of digital format binary bit mapped images as conveyed to printer 8 for rendering into physical form. The particulars of the preferred example involve a transmission of the binary bit mapped image over bus 3 to high resolution laser printer 8. It should be apparent that for grey scale and color images, the image data would involve multiple bits per pixel position.

As noted earlier, the objective of the invention is to improve the lossless compression efficiency, and in particular to improve and extend the capabilities of the LZ-1 technique as applied to bit mapped images. Thereby, the desirable compression and decompression attributes of the LZ-1 can be retained with bit mapped images, heretofore not a forte of the LZ-1 compression technique.

The invention contemplates the introduction of a run length type precompressor or preprocessor between the binary bit mapped image input data and the input to the LZ-1 compressor. As will become apparent hereinafter, the embodying precompressor stage is also lossless and is configured to compress input data with minimal complexity and to provide an output of data in a format particularly suited for LZ-1 compression. Since the efficiency of decompression is an important consideration, the corresponding run length decompressor, situated between the LZ-1 decompressor and the output of the stored binary bit mapped image data, is likewise accomplished with minimum complexity.

Figure 2:
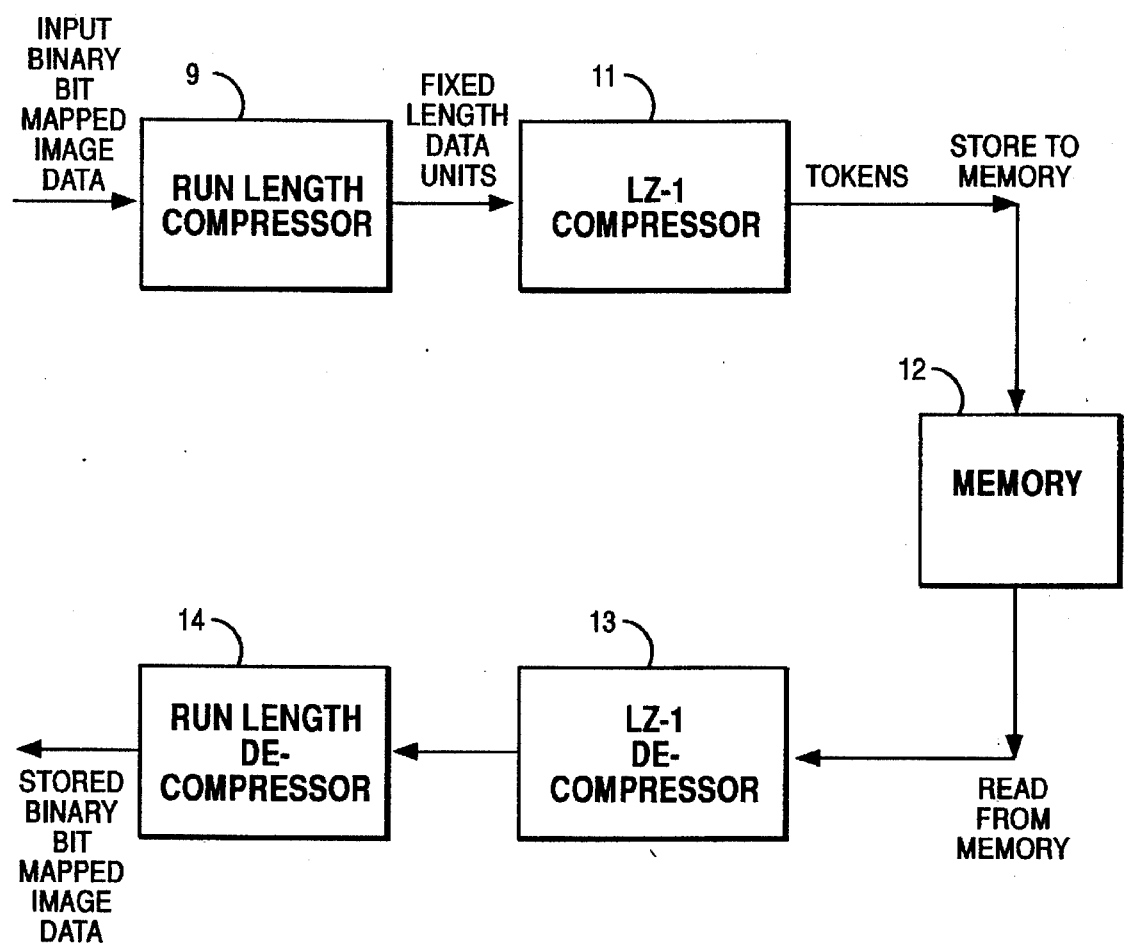
FIG. 2 is a schematic block diagram depicting two level compression and decompression of binary bit mapped image data subject to intermediate storage.

FIG. 2 depicts by functional block a preferred implementation of the invention. As shown, the input of binary bit mapped image data enters run length compressor 9, for precompression and structuring into a format particularly usable by LZ-1 compressor 11. The tokens generated by LZ-1 compressor 11 are conveyed to memory 12, which as noted earlier can in a broader sense be an aspect of a printer or a communications system. Lossless decompression of the stored tokens into binary bit mapped image data commences in LZ-1 decompressor 13. As noted earlier, the asymmetric simplicity of LZ-1 decompression, in contrast to compression, provides the tremendous speed sought when decompressing data stored in memory. Run length decompressor 14 is similarly efficient in decoding data provided by LZ-1 decompressor 13. Since decompression as implemented in run length decompressor 14 is a relatively simple operation, speed in the implementation follows.

FIG. 3 illustrates by way of abbreviated example the successive compression operations as would be performed in run length compressor 9 and LZ-1 compressor 11 on an example piece of binary bit mapped image corresponding to the artistically rendered magazine title "SCIENTIFIC AMERICAN". Resolution is presumed to be 1200 dpi. For the example, the focus of the attention is on the letters "IE" and "IF" as defined along scan line 16. Referring to the presentation at reference numeral 17, note that for the image depicted and the resolution defined, the body of the "I" is composed of 155 1s, representing the black area, followed by 225 0s, representing the white space between the "I" and "E" letters, followed in succession by 155 1s for the body of the "E" (or the corresponding body of the "F") letters followed thereafter by 187 0s for the intervening space, and concluding with 94 1s for the upper serif of the "E" (or "F") letters. Thus, the bits depicted at 17 represent the raw binary bit mapped image data along scan line 16 of either the "IE" or "IF" letter combinations.

Run length compressor 9 in FIG. 2 encodes consecutive runs of identical data bits into one or more data units (fields) individually of fixed byte size. The data run typically representing a scan line such as 16 through an image. Where the data run starts with a value of 0, and each binary value run extends along the scan line to a length of less than 254 pixel positions, the encoded byte units are merely the run lengths, in alternating succession, beginning with the number of 0s for the first byte and alternating thereafter in 1 0 1 0 ... succession. One unused byte value (255) is an escape code. It is used to denote that the run is more than 254 pixels in length, and is therefore continued in the next succeeding unit. If a scan line data run begins with a binary value of 1, in contrast to the earlier noted start with 0, the first byte is coded at the value 0. In this way, the alternating succession of byte size units can be synchronized while at the same time recognizing that the majority of scan lines will begin with a 0 value bit and therefore not require the transmission of the 0 value byte unit. With this encoding format, run length decompression as provided by decompressor 14 (FIG. 2) involves a trivial, and therefore operationally fast, design whether accomplished in hardware or by software manipulation.

The raw binary bit mapped data at 17 in FIG. 3 is run length compressed to produce the byte size units generally at 18. Note that the first group of 5 bytes represents the letters "IE" along scan line 16, while the second group of 5 bytes represents the letters "IF" along scan line 16 in run length compressed form. The original 1632 bits representing the two sets of letter combinations has been compressed into a total of 80 bits, 40 bits each for the "IE" and "IF" letter combinations. That represents a compression of approximately 20:1.

Note that the data units from the run length compressor are all of byte size, though the content of each byte differs depending upon the length of the original binary bit string along the scan line. Experience has confirmed that the LZ-1 compressor is particularly adapted to the efficient compression of byte size input data.

The output of LZ-1 compressor 11 in FIG. 2 for the run length compressed data at 18 in FIG. 3 is shown at 19. The tokens generated by the LZ-1 compressor presume that the compressor has a 512 byte history table, which size is in the moderate range. The first group of tokens, representing the "IE" information along scan line 16, are comprised of a zero bit, to indicate a raw or literal token, followed by the byte of data from the run length compressor. Since the "IE" byte string at 18 resides within the history table when the "IF" byte string is evaluated for matches, byte string matches will be identified. For each matching string of bytes, a compressed/string token is issued. As shown such token includes a 1 followed by a value 4 binary string, representing that the length of the match is 5, and concludes with a displacement value using 8 bits to identify the location of the prior matched string. The 8 bits is related to the 512 byte size of the history table. The original binary bit mapped information for the combination of the "IE" and "IF" sections of scan line 16 is thereby compressed to 59 bits, a composite compression ratio of approximately 28:1.

It should be appreciated that the example for simplicity focuses only on the compression interaction of two regions along a scan line. Clearly, the first string of tokens at 19 exhibits no compression effect, while in reality if the complete line were being compressed the data represented by such tokens would itself be compressed as a result of matches to earlier data bytes.

Examples of compression ratios, and the accentuation of compression with increases in image resolution, can be appreciated by considering the well known 1040 tax form. Using a 600 dpi resolution, the binary bit map of a blank 1040 tax form compresses in lossless form by a ratio of approximately 22:1. Increasing the resolution of the 1040 image to 1200 dpi allows the present system and method to increase the effective compression to approximately 41:1.

Preliminary investigation suggests that for typical bit mapped images used in commerce compression will range from 7:1 to 20:1 at 600 dpi and from approximately 10:1 to 40:1 for 1200 dpi formats. Theoretically the maximum compression from the 512 byte history table LZ-1 compressor is approximately 92:1 using the encoding scheme as described in U.S. Patent Office Application Ser. No. 08/290, 451. The combination of a run length compressor and LZ-1 compressor of the type to which the invention pertains can approach a theoretical maximum compression of 2700:1.

Figure 4:
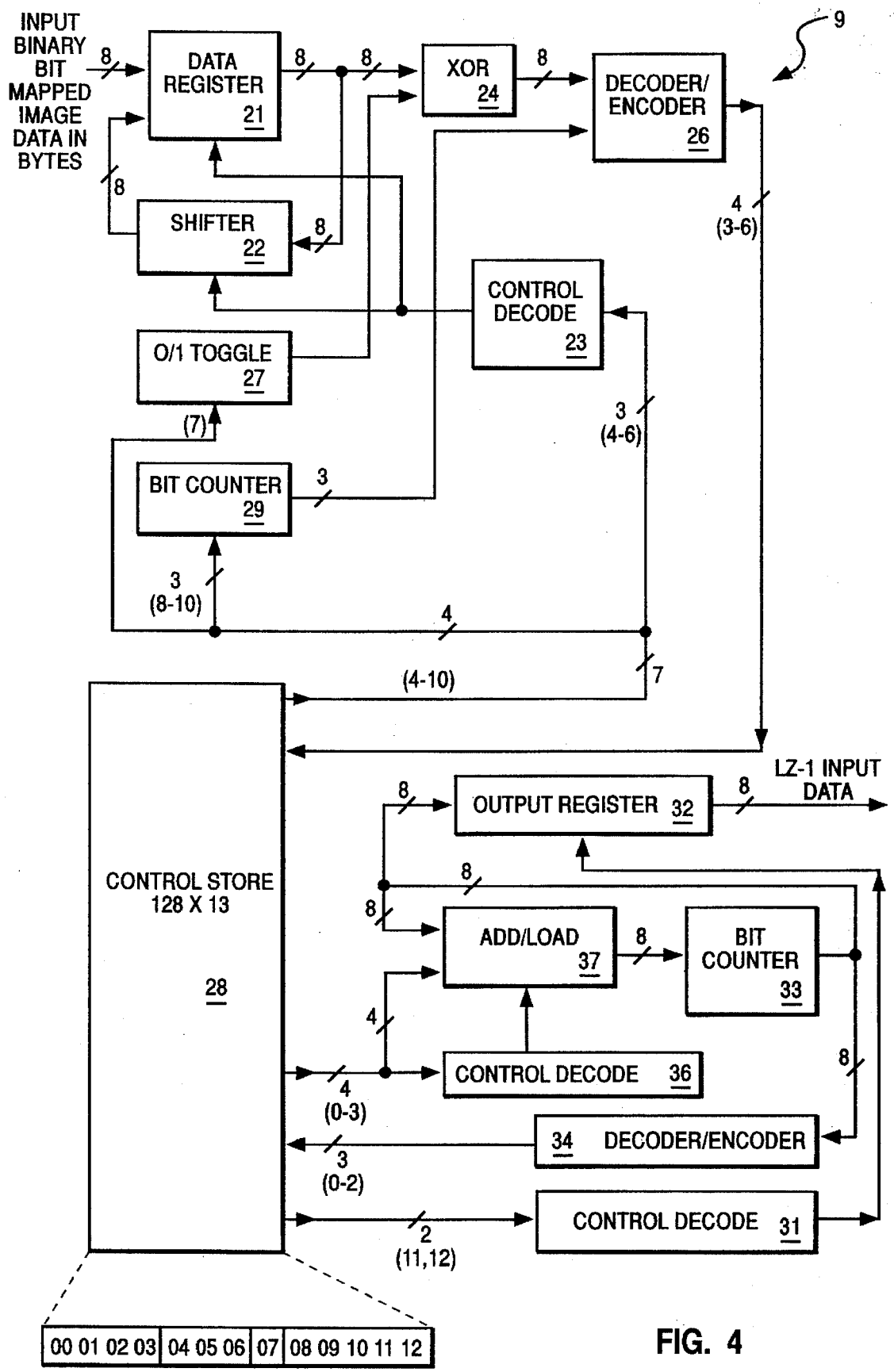
FIG. 4 is a schematic block diagram depicting functions performed by a run length compressor.

FIG. 4 depicts by functional block diagram run length compressor 9 as first shown in FIG. 2. Data register 21 can either be loaded directly with an input of binary image data in bytes or loaded from shifter 22 upon a left shift of data responsive to control decode 23. XOR 24 allows the use of the same decoder/encoder 26 irrespective of whether runs of 0s or 1s are being processed. XOR 24 is responsive to 1 bit toggle 27 as specified in master control store 28. When the toggle is set, the inverse of the content from data register 21 is generated by the XOR for decoder/encoder 26.

The true/inverse output from XOR 24 is combined with the output from bit counter 29, decoded and then reencoded in block 26 to generate a 4 bit address directed to control store 28. The 4 bits from decoder/encoder 26 represent 9 possible equations for the bytes of data in data register 21, as defined in Table A.

TABLE A

| ENCODED OUTPUT | STATUS |
|---|---|
| 1xxxxxxx | No more run bits |
| 01xxxxxx (bit count < 7) | 1 more run bit |
| 001xxxxx (bit count < 6) | 2 more run bits |
| 0001xxxx (bit count < 5) | 3 more run bits |
| 00001xxx (bit count < 4) | 4 more run bits |
| 000001xx (bit count < 3) | 5 more run bits |
| 0000001x (bit count < 2) | 6 more run bits |
| 00000001 (bit count = 0) | 7 more run bits |
| 00000000 (bit count = 0) | 8 more run bits |

Bits 04, 05 and 06 from control store memory 28 control the load and shift operations in data register 21. The control signals are decoded by control decoder and then are used to control shifter 22 and data register 21 as defined in Table B.

TABLE B

| 04 | 05 | 06 | OPERATION |
|---|---|---|---|
| 0 | 0 | 0 | Load from input data bus |
| 0 | 0 | 1 | Shift 1 bit to left |
| 0 | 1 | 0 | Shift 2 bits to left |
| 0 | 1 | 1 | Shift 3 bits to left |
| 1 | 0 | 0 | Shift 4 bits to left |
| 1 | 0 | 1 | Shift 5 bits to left |
| 1 | 1 | 0 | Shift 6 bits to left |
| 1 | 1 | 1 | Shift 7 bits to left |

Note that bit 07 from control store 28 is used to control toggle 27. The remaining bits 08, 09 and 10 from control store 28 are loaded into bit counter 29 with each cycle to reflect the number of bits in data register 21 which are now valid after the shift specified by control store bits 04, 05 and 06. The 13 bits from control store 28 are summarized in Table C, showing their functions and blocks they control.

TABLE C

| | |
|---|---|
| 00, 01, 02, 03 | Bit counter, add/load |
| 04, 05, 06 | Data register, load/shift |
| 07 | (0/1, toggle) |
| 08, 09, 10 | New bit count value |
| 11, 12 | Output control |

Referring again to FIG. 4, note that output control bits 11 and 12 are decoded in control decoder 31 and thereupon used to control output register 32. Output register 32 is loaded from bit counter 33, the output of which is decoded by decoder/encoder 34 into a 3 bit address directed to control store memory 28. The bits from decoder/encoder 34 represent the 8 possible values for bit counter 33 as specified in Table D.

TABLE D

| |
|---|
| Bit count = 253 |
| Bit count = 252 |
| Bit count = 251 |
| Bit count = 250 |
| Bit count = 249 |
| Bit count = 248 |
| Bit count = 247 |
| Bit count is less than or equal to 246 |

Control store output bits 00, 01, 02 and 03 are used to either add or load a value into bit counter 33 based upon the state decoded in control decode 36 as applied to add/load block 37. The operations and values associated with control store bits 01–03 are set forth in Table E.

TABLE E

| 00 | 01 | 02 | 03 | OPERATION |
|---|---|---|---|---|
| 0 | 0 | 0 | 0 | Add 8 |
| 0 | 0 | 0 | 1 | Add 1 |
| 0 | 0 | 1 | 0 | Add 2 |
| 0 | 0 | 1 | 1 | Add 3 |
| 0 | 1 | 0 | 0 | Add 4 |
| 0 | 1 | 0 | 1 | Add 5 |
| 0 | 1 | 1 | 0 | Add 6 |
| 0 | 1 | 1 | 1 | Add 7 |
| 1 | 0 | 0 | 0 | Load 8 |
| 1 | 0 | 0 | 1 | Load 1 |
| 1 | 0 | 1 | 0 | Load 2 |
| 1 | 0 | 1 | 1 | Load 3 |
| 1 | 1 | 0 | 0 | Load 4 |
| 1 | 1 | 0 | 1 | Load 5 |
| 1 | 1 | 1 | 0 | Load 6 |
| 1 | 1 | 1 | 1 | Load 7 |

Control store output bits 11 load the incremented value of bit counter 33 into output register 32. Bits 12, which are decoded together with bit 11 in control decode 31, load the value 255 into output register 32.

With further reference to the functional depiction in FIG. 4, count byte values of 1 through 254 from output register 32 specify a run count of 1 through 254. Successive bit count fields within this value range represent runs of successively opposite binary values. Thus, if a run of 0s is specified by the first byte and has a range of 1 through 254, the next byte will always specify a run of 1s, and vice versa.

The byte value 255 is used for those situations where a longer run than 254 is encountered in the input data stream. That number indicates that the current binary value run is longer than 254 bits, and that the excess length above the value 254 is encoded in the next successive byte. Long runs are thereby encoded as a series of bytes with the value 255, terminating with a byte of a value in the range of 1 through 254.

The byte value 0 is reserved for those situations where the input data is actually started with a binary 1 bit mapped value. It could be thought of as specifying a run length of 0 0s, the next byte then being the actual run count for the 1s that start the data stream. The byte value 0 can also be used as a terminating byte, if needed, since it is normally not coded in any other position other than the first.

Several examples of various run length codings according to the present invention appear in Table F.

TABLE F

| Input Binary Data Stream | Encoded Data by Byte |
| --- | --- |
| 0.(7 0's).01.(3 1's).10.(5 0's).0 | 7,3,5 |
| 0.(530 0's).01.(200 1's).1 | 255,255,22,200 |
| 1.(9 1's).10.(4 0's).01.(6 1's).1 | 0,9,4,6 |

Note that the run length compressor as embodied herein allows for a maximum data compression of 32:1, given that approximately 32 bytes of input data can be encoded into a single byte size unit if the input data is consistently all 0s or all 1s. Conversely, however, input data consisting of strictly alternating 0s and 1s would expand, as encoded herein, in that each bit encodes to a single byte. For that reason, run length compression of the present form is particularly suited for business, financial or medical form type image data. Such images exhibit significant regional repetition. The other end of the spectrum, namely those pages likely to exhibit significantly less compression, are characterized by graphic images with numerous random patterns.

Binary bit mapped image data which is run length compressed in the manner described hereinbefore, is provided in byte format as the input to the LZ-1 stage of the dual stage compressor to which the present invention pertains. See FIG. 2. Though multiple stage compressors have been disclosed, such as in U.S. Pat. Nos. 4,316,222, 4,971,407, 4,626,829 and 5,109,433, there has not been an appreciation for the benefits that can accrue when the output format of the first compressor is optimally matched to the input format of the second compressor. As noted earlier, the selection of fixed size units as the outputs from run length compressor 9 and the corresponding inputs to LZ-1 compressor 11 compliments the operations of each in an optimizing manner.

Figure 5A:
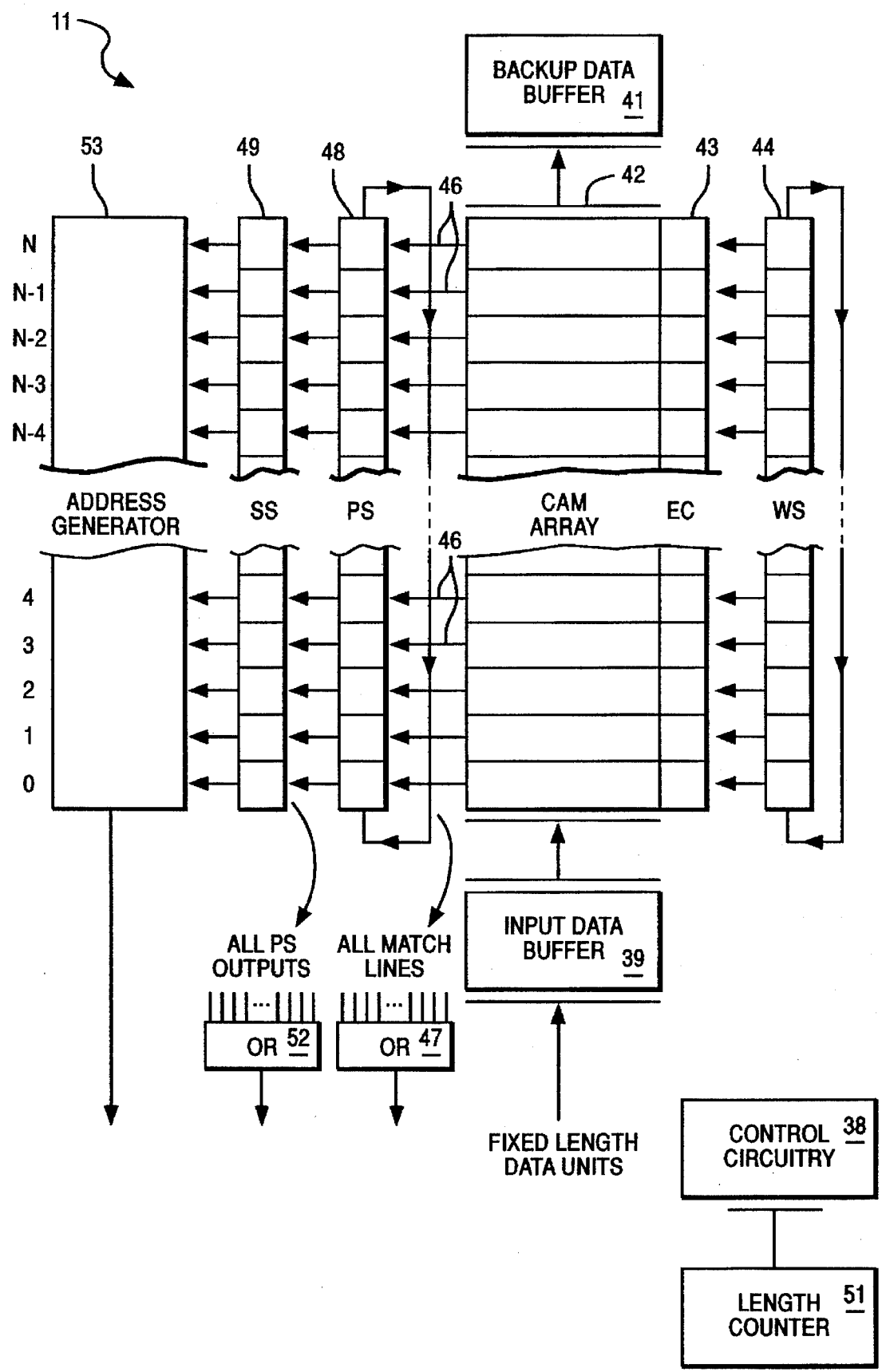
FIG. 5A is a schematic block diagram of an LZ-1 compressor using a content addressable memory (CAM).

FIG. 5A depicts a representative LZ-1 compressor architecture. As shown, the architecture coincides with that described in the aforementioned U.S. patent application Ser. No. 08/290,451, incorporated herein by reference. The key aspect of the implementation relates to the use of a content addressable memory (CAM) to compare incoming strings of data with previously received and processed data as stored in the CAM memory. As would be expected by the presence of the CAM, this embodiment focuses on a hardware implementation of LZ-1 compressor 11 (FIG. 2).

The CAM form of the LZ-1 compressor depicted in FIG. 5A is managed by control circuit 38, which control circuit is connected to each of the elements in FIG. 5A while operating as a state machine. The LZ-1 input data enters input data buffer 39 and is later stored in backup data buffer 41. The data stored in input data buffer 39 is compared with all current entries in CAM array The CAM array includes multiple sections (N+1 sections being shown in the figure) with each section including a register and a comparator as more clearly illustrated in FIG. 5B. Each CAM array register stores a byte of data and includes a single cell 43 for indicating whether a valid or current data byte is stored in the CAM array register. Each comparator generates a match or active signal when the data bytes stored in the corresponding CAM array register match the data bytes stored in the input data buffer 39, with some refinements.

Coupled to the CAM array is a write select shift register (WS), identified by reference numeral 44, with one write select cell for each section of the CAM array. As embodied, a single write cell is set to a 1 value while the remaining cells are all set to 0 values. The active write select cell, the cell having a 1 value, selects which section of the CAM array will be used to store the data byte currently held in input data buffer 31. Write select shift register 44 is shifted one cell for each new data byte entered into input data buffer 39. The use of shift register 44 to select allows the use of fixed addressing within CAM array 42.

Current entries in the CAM array are designated as those CAM array sections that have empty cells (EC) 43 set to 1 and have corresponding write select (WS) cells 44 set to 0. If the data in any of the current CAM entries matches the data byte in input data buffer 41, then the comparator for the CAM array section generates an active match signal on the corresponding match line 45. Thereupon, match OR gate 47, which is connected to each of the match lines, generates an overall match signal. The primary selector shift register (PS) 48 identifies the sections in the CAM array where a successful match has been identified. Thereby, PS cells which are set to 1, the active state, indicate which CAM array sections contain the last word of a matching string, or a sequence, of data bytes. Multiple cells in the PS column 48 may be active at any one time because a number of locations in the CAM array may have detected matches with incoming data bytes. If no previous matches are detected for incoming data bytes, a raw or literal token is generated by LZ-1 compressor 11, preferably composed of 9 bits beginning with a 0 prefix and followed by the 8 bit byte of the raw data.

Prior to the loading of a new data byte into input data buffer 39, the previous entry in that buffer is saved in backup data buffer 41. In addition, the contents of the column of PS cells 48 are saved in a corresponding secondary selector (SS) register Furthermore, length counter 51 is incremented by one to maintain a count of the matching string. Finally, primary selector cells 48 and write selector cells 44 are shifted by one location such that the entry for the Mth primary selector cell 48 is now stored in the (M+1)th primary selector cell, and the entry for the Mth write selector cell is now stored in the (M+1)th write selector cell. These shifts accomplish two things. First, they shift the single active write selector entry one cell so that the next incoming data byte is written into the next sequential section of the CAM array. Secondly, they shift the active cells in the primary selector column so that each corresponds to the CAM array sections immediately subsequent to the previous matching CAM array sections.

The next input data byte is loaded into input data buffer 39 and compared to all current entries in the CAM array as described previously. The match lines for all CAM array data cell entries that match the new data byte become active upon comparison. If any match line is active, then match OR gate 47 will also be active. All active primary selector cells 48 whose corresponding match lines are not active are then cleared. If any of the primary selector cell entries remains active, indicating that the current data byte in input data buffer 39 extends the previous matching string of data bytes, then primary selector OR gate 52 becomes active. Gate 52 is connected to each of the primary selector cells 48. Thereby, an input data byte is processed to determine whether it continues a previously identified match string.

The matching process continues until there is a 0 at the output of the primary selector OR gate 52, signifying that there are no matches left. When this occurs, the values marking the end points of all the matching strings which existed prior to the last data byte are still stored in secondary selector cells 49. Address generator 53 then determines the location of one of the matching strings and generates its address. Address generator 53 is readily designed to generate an address using signals from one or more cells of the secondary selector 49. The length of the matching string is available in length counter 51.

Address generator 53 generates the fixed address for the CAM array section containing the end of the matching string, while length counter 51 provides the length of the matching string. A start address and length of the matching string is then calculated, coded and output as a compressed or string token.

Figure 5B:
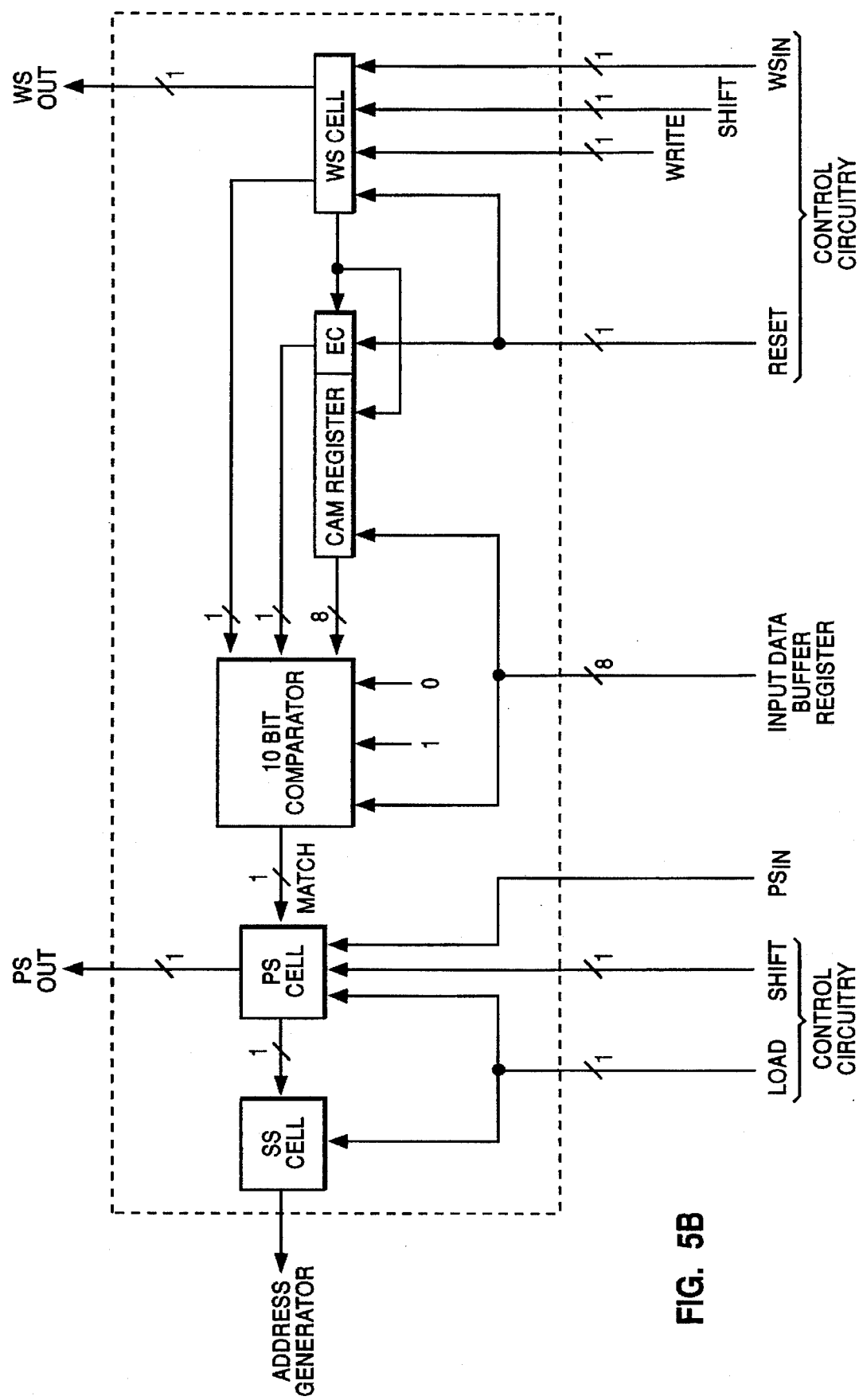
FIG. 5B is a schematic block diagram illustrating the elements within a section of the CAM of FIG. 5A.

FIG. 5B contains a schematic block diagram illustrating in somewhat greater detail a sample section of the CAM array and directly associated write select cell, empty cell, primary selector cell and secondary selector cell. Connections between the representative cells, the CAM register and the comparator are fully shown.

The parallel processing capability of the CAM implementation in FIG. 5A provides an extremely fast compression as well as an exhaustive search of the data within the history window. Incoming data bytes are compared to all possible candidates within the history simultaneously. The CAM array holds the current history. During the search part of each cycle, the system marks all locations where a match is found to the incoming data by setting corresponding bits in primary select shift register 48.

Write select shift register 44 normally has only a single bit, which defines the CAM array location subject to update with the incoming data byte during the new data entry segment of each cycle. At the conclusion of each cycle, the write select and primary select shift registers are shifted by one bit position in preparation for receiving and processing the next byte of data.

Once a match is started, subsequent search operations are used only to reset corresponding primary selector shift register bits. The string search process continues so long as at least one primary selector shift register bit is on. This approach uses a circular history structure, rather than the classical LZ-1 history structure, though the two are equivalent as to function. As embodied, a single byte of input data is evaluated with each cycle.

Address decoder 53 functions as a RAM. Thereby, the embodiment of FIG. 5A includes both encoding and decoding features. Note the CAM array and decompressor 13 (FIG. 2) SRAM incorporated into the same structure and thereby are readily manufacturable on the same integrated circuit device.

Evaluations of various size CAM arrays has confirmed that a history size of approximately 512 bytes provides an ideal tradeoff between efficient compression and cost, in terms of such factors as power consumption and silicon area on integrated circuit devices.

Figure 6:
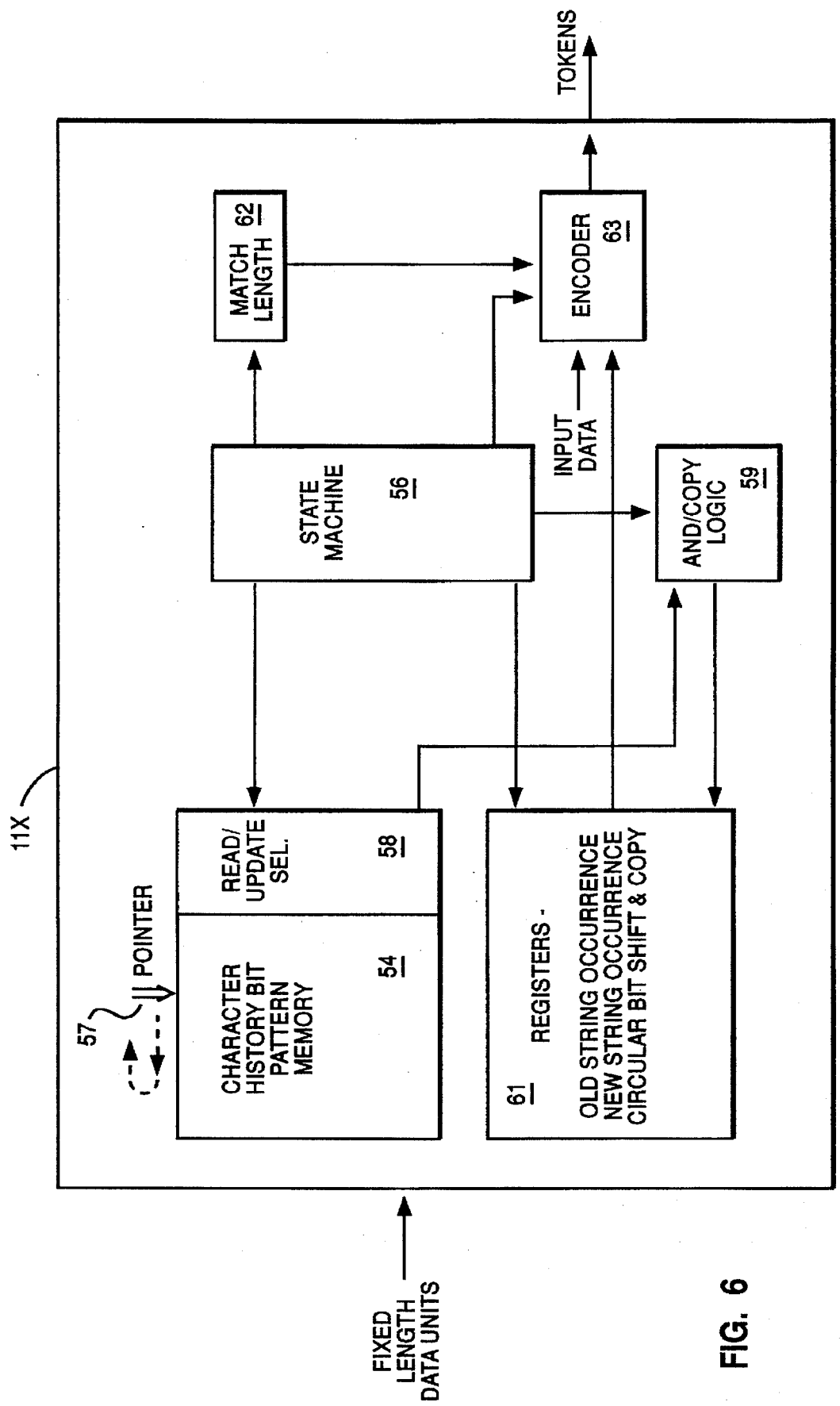
FIG. 6 is a schematic block diagram illustrating the functions in a character history bit pattern memory form of the LZ-1 compressor.

FIG. 6 illustrates by function block diagram an alternate implementation of LZ-1 compressor 11, as identified by reference numeral 11X. The LZ-1 compressor implementation in FIG. 6 utilizes a character history bit pattern memory in contrast to the use of a CAM. The difference coincides with the distinction between a software implementation, this version, versus a hardware implementation, the CAM array version, of the LZ-1 compressor. As shown, the illustrated LZ-1 compressor 11X represents the embodiment described in the aforementioned U.S. patent application Ser. No. 08/355,865, the subject matter of which was incorporated by reference herein, which further extended concepts described in U.S. patent application Ser. No. 08/173,738, the subject matter of which was also incorporated by reference herein.

The LZ-1 compressor 11X in FIG. 6 includes character history bit pattern memory 54, which will typically be a uniquely defined section of a cache or main memory within a computer system. As each fixed length data unit is received, state machine 56, programmed within the computer, undertakes specified operations within the system by generating control signals for sending data to related functional elements. Character history bit pattern memory 54 stores marker bits at locations in the matrix coincident with new data characters (specifying a row address), and the order of occurrence of that character as defined by circular pointer 57 indexed or incremented with the processing of new units. Pointer 57 identifies the column position of the marker corresponding to each new data unit. Addressing of the markers in memory 54 is responsive to update and read signals generated by state machine 56, as implemented through the read/update select section 58 of memory 54.

The rows of marker bits for each data unit within memory 54 are selectively conveyed to AND/COPY logic block 59. Block 59 is enabled by state machine 11 to perform a bit-wise AND operation on a row from memory 54 with a corresponding string of bits from the old string occurrence register of register block 61, and to provide the outcome by bit to the new string occurrence register within block 61.

The copy logic in block 59 is selectively enabled by state machine 56 to convey a row of marker data bits to the new string occurrence register of block 61. Block 61 of registers also includes a circular bit shift register and copy register, both also enabled by state machine 11. The shifted and copied marker bits are selectively transferred from the new string occurrence register in block 61 to the old string occurrence register in block 61. An efficient way to accomplish the shifting between registers is to ping/pong two registers during operation.

As state machine 56 cycles with the receipt of new fixed length data units, matches to strings of previously received data units, as represented by the pattern of markers in character history bit pattern memory 54, are counted in match length block 62. Encoder 63 immediately generates an output token of raw/literal form when the data is not compressed. In contrast, when the encoder output is to be a compressed/string token, the issuance is delayed until the maximum possible length of the matching input data string is attained for each token. The length of the compressed/string token is provided by block 62, while the location of the matching data unit string is derived from a set bit index in the old string occurrence register of block 61.

The dual stage lossless compressor to which the invention pertains is particularly efficient in compressing bit mapped image data as a consequence of a synergistic compatibility between form of the output data from the first compressor stage, the run length compressor, and the form of ideal input data to the second compressor stage, the LZ-1 compressor, as effects their composite ability to efficiently compress data.

In this regard, the first stage run length compressor operates efficiently on binary bit mapped image data and provides as an output a succession of fixed length data units, preferably of byte size. The complementing stage LZ-1 compressor receives the fixed length data units from the first compressor in a form which the LZ-1 compressor is particularly capable of efficiently compressing. Namely, the units are of fixed length and when defining video images are characterized by repetitive groupings. Lastly, the asymmetry of the LZ-1 compressor and simplicity of the run length compressor provides fast decompression even with dual stage processing. Therefore, the composite is particularly suited to systems in which the data storage resources are limited and decompression must be accomplished with relative speed.

Though the invention has been described and illustrated by way of specific embodiments, the methods and systems encompassed by the invention should be interpreted to be in keeping with the breadth of the claims set forth hereinafter.

I claim:

1. A digital data lossless compression apparatus, comprising:

a source of binary format serial input data;

first compression means for receiving the serial input data and run length compressing the binary format serial input data into first data units of a fixed first size;

means for coding the first data units of fixed first size to individually represent run lengths of consistent binary value as appears within the serial input data;

second compression means for receiving succession of first data units of fixed first size and Lempel-Ziv sliding window compressing the first data units of fixed first size into tokens of both fixed size types and variable size types; and means for transmitting the tokens.

2. The apparatus recited in claim 1, further comprising:

memory means for receiving and storing the tokens.

3. The apparatus recited in claim 2, wherein the binary format serial input data is a bit mapped video image in raster scan line format.

4. The apparatus recited in claim 3, wherein the first data units are of byte size with the byte code indicating changes in the binary value.

5. The apparatus recited in claim 4, wherein the second compression means uses a content addressable memory (CAM) and generates raw and compressed tokens.

6. The apparatus recited in claim 1, wherein the means for transmitting is an audio-visual communication media.

7. The apparatus recited in claim 6, wherein the binary format serial input data is a bit mapped video image in raster scan line format.

8. The apparatus recited in claim 7, wherein the first data units are of byte size with the byte code indicating changes in the binary value.

9. The apparatus recited in claim 8, wherein the second compression means uses a content addressable memory (CAM) and generates raw and compressed tokens.

10. The apparatus recited in claim 1, wherein the binary format serial input data is a bit mapped video image in raster scan line format.

11. The apparatus recited in claim 10, wherein the first data units are of byte size with the byte code indicating changes in the binary value.

12. The apparatus recited in claim 11, wherein the second compression means uses a content addressable memory (CAM) and generates raw and compressed tokens.

13. A method of losslessly compressing digital data, comprising the steps of:

receiving binary format serial input data;

run length compressing received binary format serial input data into first data units of a fixed first size;

coding the first data units of fixed first size to individually represent run lengths of consistent binary value as appears within the serial input data;

Lempel-Ziv sliding window compressing a succession of first data units of fixed first size into tokens of both fixed size types and variable size types; and transmitting the tokens.

14. The method recited in claim 13, further comprising the step of:

storing received tokens in a memory.

15. The method recited in claim 14, wherein the binary format serial input data is a bit mapped video image in raster scan line format.

16. The method recited in claim 15, wherein the first data units are of byte size with the byte code indicating changes in the binary value.

17. The method recited in claim 16, wherein the Lempel-Ziv sliding window compressing is performed with a content addressable memory (CAM) and generates raw and compressed tokens.

18. The method recited in claim 13, wherein the step of transmitting is performed over an audio-visual communication media.

19. The method recited in claim 18, wherein the binary format serial input data is a bit mapped video image in raster scan line format.

20. The method recited in claim 19, wherein the first data units are of byte size with the byte code indicating changes in the binary value.

21. The method recited in claim 20, wherein the Lempel-Ziv sliding window compressing is performed with a content addressable memory (CAM) and generates raw and compressed tokens.

22. The method recited in claim 13, wherein the binary format serial input data is a bit mapped video image in raster scan line format.

23. The method recited in claim 22, wherein the first data units are of byte size with the byte code indicating changes in the binary value.

24. The method recited in claim 23, wherein the Lempel-Ziv sliding window compressing is performed with a content addressable memory (CAM) and generates raw and compressed tokens.

* * * * *